(12) United States Patent
Poulton et al.

(10) Patent No.: US 10,644,686 B2
(45) Date of Patent: *May 5, 2020

(54) SELF-CLOCKING SAMPLER WITH REDUCED METASTABILITY

(71) Applicant: NVIDIA Corporation, Santa Clara, CA (US)

(72) Inventors: John W. Poulton, Chapel Hill, NC (US); Sudhir Shrikantha Kudva, Durham, NC (US); Stephen G. Tell, Chapel Hill, NC (US); John Michael Wilson, Wake Forest, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,839

(22) Filed: Dec. 2, 2019

(65) Prior Publication Data

US 2020/0106428 A1 Apr. 2, 2020

Related U.S. Application Data

(63) Continuation of application No. 15/693,325, filed on Aug. 31, 2017.

(51) Int. Cl.
*H03K 3/356* (2006.01)
*H03K 5/135* (2006.01)
(Continued)

(52) U.S. Cl.
CPC .............. *H03K 5/135* (2013.01); *G05F 1/575* (2013.01); *H02M 3/1563* (2013.01);
(Continued)

(58) Field of Classification Search
CPC ....... H03K 3/356139; H03K 3/356191; H03K 5/135; H03K 19/0966; H02M 3/156; H02M 3/1563; G05F 1/575
See application file for complete search history.

(56) References Cited

U.S. PATENT DOCUMENTS 6,411,157 B1 6/2002 Hsu et al.
6,495,995 B2 12/2002 Groom et al.
(Continued)

OTHER PUBLICATIONS

Kwak, et al., "A self-adjustable clock generator with wide dynamic range in 28 nm FDSOI," IEEE Jounral of Solid-State Circuits, vol. 51, No. 10, Oct. 2016, pp. 2368-2379.
(Continued)

*Primary Examiner* — Patrick O Neill
(74) *Attorney, Agent, or Firm* — Leydig, Voit & Mayer, Ltd.

(57) ABSTRACT

A circuit, method, and system are disclosed for sampling a signal. The system includes a sampler circuit configured to sample input signals when a clock signal is at a first voltage level to produce sampled signals, a detection circuit that is coupled to the sampler circuit, and a feedback circuit that receives an output signal and generates the clock signal. The detection circuit pre-charges the sampled signals when the clock signal is at a second voltage level and, using threshold adjusted inverters, detects voltage levels of each sampled signal to produce detected voltage levels, where a threshold voltage of the threshold adjusted inverters is entirely outside of a transition voltage range of the sampler circuit. In response to one of the detected voltage levels transitioning from the second level to the first level, the detection circuit transitions the output signal from the first voltage level to the second voltage level.

20 Claims, 15 Drawing Sheets

(51) Int. Cl.
G05F 1/575 (2006.01)
H02M 3/156 (2006.01)
H03K 19/096 (2006.01)
(52) U.S. Cl.
CPC . *H03K 3/356139* (2013.01); *H03K 3/356191* (2013.01); *H03K 19/0966* (2013.01)

(56) References Cited

U.S. PATENT DOCUMENTS

| | | |
|---|---|---|
| 9,189,202 B2 | 11/2015 | Burleson et al. |
| 9,395,746 B2 | 7/2016 | Chung et al. |
| 9,552,892 B1 * | 1/2017 | Kosonocky ............ G11C 27/02 |
| 9,973,357 B2 * | 5/2018 | Sakai ................ H04L 25/03057 |
| 2012/0154059 A1 | 6/2012 | van der Wel et al. |
| 2018/0054187 A1 * | 2/2018 | Sadowski ................ H03K 5/13 |

OTHER PUBLICATIONS

Cypress Semiconductor Corporatin, "Are Your PLDs Metastable," Mar. 6, 1997, pp. 1-19, retrieved from www.uio.no/studier/emner/matnat/fys/FYS3270/h04/.../doc/appnotes/pldmeta.pdf.

* cited by examiner

SELF-CLOCKING SAMPLER WITH REDUCED METASTABILITY

CLAIM OF PRIORITY

This application is a continuation of U.S. application Ser. No. 15/693,325 titled "Self-Clocking Sampler With Reduced Metastability," filed Aug. 31, 2017, the entire contents of which are incorporated herein by reference.

FIELD OF THE INVENTION

The present invention relates to sampler circuits, and more particularly to a self-clocking sampler circuit with reduced metastability.

BACKGROUND

High speed signal sampler circuits have metastability problems due to having limited time available for resolving a voltage level at a cross coupled node compared with a signal sampler circuit operating at a lower speed. The metastability problem is exacerbated when a high speed sampler circuit is used in a feedback loop to regulate two input voltages to be close to each other, as in case of power supply regulation. Conventional techniques, such as inputting the output of the sampler circuit through a series of metastability hardened flip-flops to synchronize the output increases the response time. Increasing the response time may not be tolerable for regulating the power supply voltage of an integrated circuit. There is a need for addressing these issues and/or other issues associated with the prior art.

SUMMARY

A method, circuit, and system are disclosed for sampling a signal. A self-clocked sampler system, comprises a sampler circuit configured to sample input signals when a clock signal is at a first voltage level to produce sampled signals, a detection circuit that is coupled to the sampler circuit, and a feedback circuit configured to receive an output signal and generate the clock signal. The detection circuit is configured to pre-charge the sampled signals when the clock signal is at a second level, and using threshold adjusted inverters, detect voltage levels of each sampled signal to produce detected voltage level signals, where a threshold voltage of the threshold adjusted inverters is entirely outside of a transition voltage range of the sampler circuit. In response to one of the detected voltage level signals transitioning from the second voltage level to the first voltage level, the detection circuit transitions the output signal from the first voltage level to the second voltage level.

DETAILED DESCRIPTION

A self-clocking sampler system generates the clock signal from the sampled signal and varies the clock frequency based on the time needed for the cross coupled nodes to resolve the sampled voltage levels and reach a stable state. When more time is needed for the sampled signals to resolve, generation of the clock edge is delayed resulting in a clock having a variable frequency. The self-clocking sampler system may be used to regulate two input voltages to be close to each other for power supply regulation.

Figure 1A:
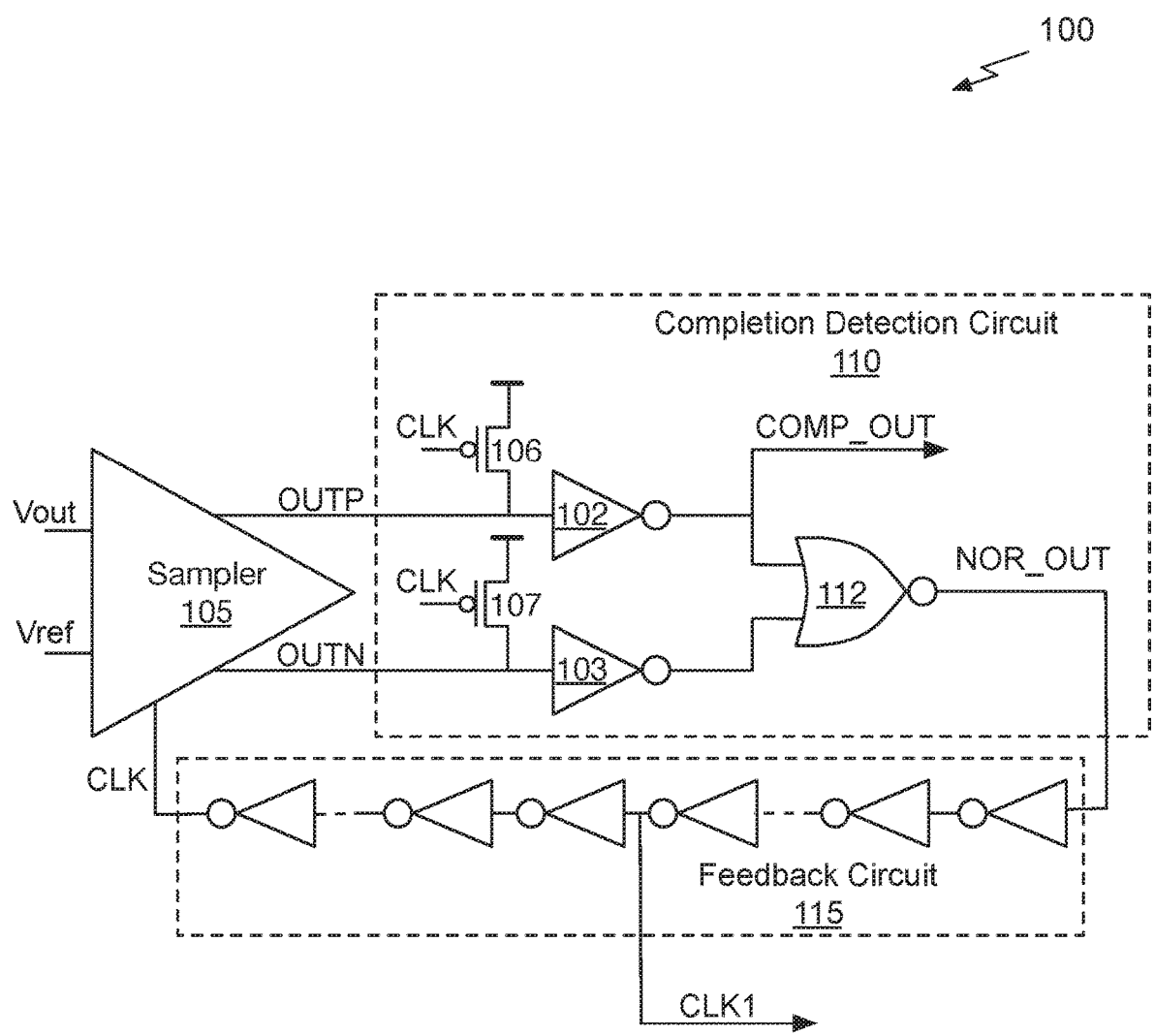
FIG. 1A illustrates a self-clocked sampler system, in accordance with one embodiment.

FIG. 1A illustrates a self-clocked sampler system 100, in accordance with one embodiment. The self-clocking sampler system 100 includes a sampler circuit 105, a completion detection circuit 110, and a feedback circuit 115 configured in a loop, as shown in FIG. 1A. In one embodiment, the sampler circuit 105 is a standard master stage of cross-coupled sampler circuit. The self-clocking sampler system 100 operates in two different phases (i.e., modes). The sampler 105 samples the voltage levels of Vout and Vref during an evaluate phase and generates output signals OUTP and OUTN. The completion detection circuit 110 includes two transistors 106 and 107 that are configured to pre-charge the signals OUTP and OUTN to a power supply voltage during a pre-charge phase. The completion detection circuit 110 includes two threshold adjusted inverters 102 and 103 that ensure voltages at OUTP and OUTN have sufficiently separated during the evaluate phase, and are not in a metastability state (i.e., are stable) before the output of one of the threshold adjusted inverters 102 and 103 changes. As shown in FIG. 1A, the two transistors 106 and 107 are PMOS devices and the two threshold adjusted inverters 102 and 103 are low threshold voltage inverters.

A voltage switching threshold range of the threshold adjusted inverters 102 and 103 is entirely outside of a transition voltage range of the sampler 105. Importantly, the voltage threshold at which the transistors switch is a range that accounts for process, supply voltage, and temperature (PVT) variations. Likewise, the transition voltage range of the sampler 105 accounts for PVT variations. Consequently, there is no overlap between the threshold voltage range of the threshold adjusted inverters and the transition voltage range of the sampler 105. The threshold adjusted inverters 102 and 103 sense a change in the state of one of the OUTP and OUTN signals and transition the output of one of the threshold adjusted inverters 102 and 103 high when detection of the state change is complete during the evaluate phase.

The outputs of the two threshold adjusted inverters 102 and 103 are combined using a NOR gate 112 to generate a negative transition (i.e., edge) for a NOR_OUT signal when either of the OUTP or OUTN signals transitions low during the evaluate phase. The feedback circuit 115 includes an even number of inverters to generate the clock signal CLK. The negative transition of NOR_OUT passes through the feedback circuit 115 to generate a negative transition of the clock signal CLK and initiate the pre-charge phase. The negative transition of the NOR_OUT signal generates a next edge of the clock signal CLK that is input to the sampler 105 resulting in the self-clocking feature of the self-clocking sampler system 100.

The output of one of the two threshold adjusted inverters 102 and 103 (e.g., the detected voltage level signals) may be used as a voltage comparison output signal, COMP_OUT. COMP_OUT may be provided as an input to additional logic, such as a control loop stage for a voltage regulator implementation. A CLK1 signal may be generated at the output of an inverter in the feedback circuit 115, such that an odd number of inverters are in series between the NOR gate 112 and the inverter that outputs the CLK1 signal. In one embodiment, the CLK1 signal may be used as a clock signal input to a positive edge triggered flip-flop to capture the COMP_OUT signal. In one embodiment, the CLK1 signal may be buffered and then used to clock subsequent logic stages.

During the pre-charge phase, when CLK is low, both signals OUTP and OUTN are charged to a power supply voltage to generate a positive transition of NOR_OUT. The positive transition of NOR_OUT passes through the feedback circuit 115 to generate a positive transition of the clock signal CLK and initiate the evaluate phase, when CLK is high. One or more of the inverters in the feedback circuit 115 may have a programmable delay so that the frequency of the clock signal CLK can be controlled to achieve a desired frequency. For example, the frequency of CLK may be increased, to increase the maximum frequency at which Vout and Vref are sampled, by reducing the delay through the feedback circuit 115.

The self-clocking sampler system 100 avoids the need for series coupled metastability hardened flip-flops and reduces the feedback loop delay, thereby improving response time. Quick response time is needed to regulate a supply voltage level, such as Vout to be close to Vref while also limiting voltage ripple. The self-clocking sampler system 100 may be integrated into a die including a processor to regulate a voltage level and the higher switching frequencies at which the sampler 105 is operated limits the voltage ripple of Vout. In a conventional integrated circuit, the higher frequency would increase the probability of metastability. However, the self-clocking feature of the self-clocking sampler system 100 prevents the likelihood of metastability.

In the context of the following description a negative transition is a falling transition from a high voltage to a low voltage, a positive transition is a rising transition from a low voltage to a high voltage, a low voltage may be a low power supply, such as ground, and a high voltage may be a high power supply, such as VDD. A high voltage may be a logic TRUE and a low voltage level may be a logic FALSE.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
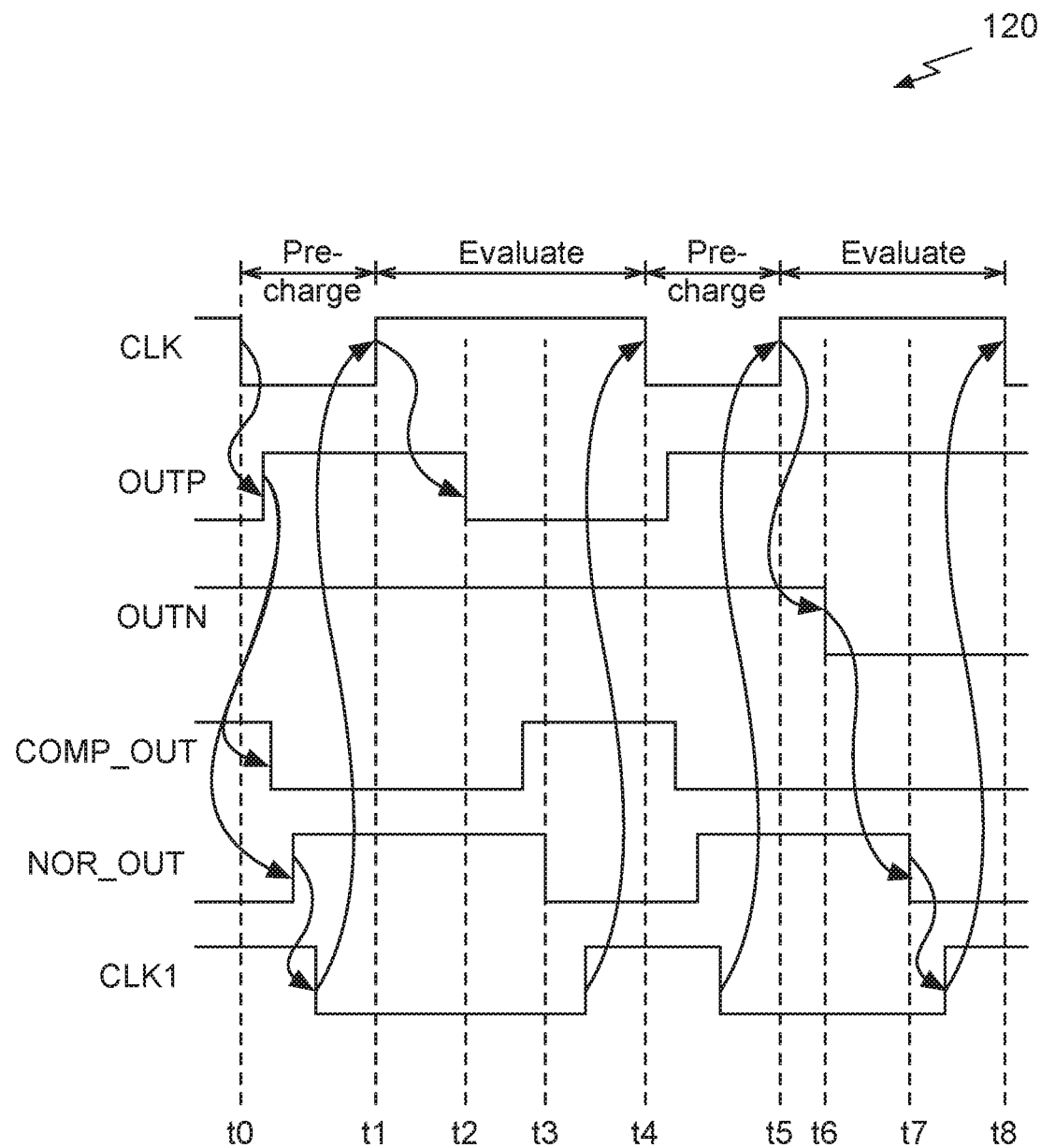
FIG. 1B illustrates a timing diagram of signals generated within the self-clocked sampler system shown in FIG. 1A, in accordance with one embodiment.

FIG. 1B illustrates a timing diagram 120 of signals generated within the self-clocked sampler system 100 shown in FIG. 1A, in accordance with one embodiment. Although the rising and falling transitions of the signals are shown as instantaneous, the rising and falling transitions may have slopes that vary over time. When the clock signal CLK that is input to the sampler 105 transitions low at time t0, a pre-charge phase begins and OUTP and OUTN are both pre-charged high. The resulting rising transition of OUTP causes COMP_OUT to transition low and NOR_OUT to transition high. The rising transition of NOR_OUT propagates through the feedback circuit 115 to generate a rising edge of the clock signal CLK at time t1, ending the pre-charge phase. Note that the duration of the pre-charge phase is nearly constant, varying as operating conditions change to vary the signal propagation delay times through the threshold adjusted inverters 102 and 103, the NOR gate 112, and the feedback circuit 115.

At time t1, the evaluate phase begins and the sampler 105 samples the voltage levels of Vout and Vref. During the evaluate phase, one of the signals OUTP and OUTN may be driven low by the sampler 105. In one embodiment, OUTP is driven low when Vout is less than Vref and OUTN is driven low when Vout is greater than Vref.

As shown in FIG. 1B, the signal OUTP is driven low at time t2. The threshold adjusted inverter 102 detects completion of the transition of OUTP from high to low when OUTP falls below the entire transition range of the sampler 105 and reaches the threshold voltage of the NMOS transistor in the threshold adjusted inverter 102. The COMP_OUT signal transitions high, indicating completion of the transition. The NOR_OUT signal transitions low at time t3.

The rising transition COMP_OUT causes NOR_OUT to transition low at time t3. The falling transition of NOR_OUT propagates through the feedback circuit 115 to generate a falling edge of the clock signal CLK at time t4. Note that the duration of the evaluate phase, measured as the delay from time t1 to t4 may vary based on a slope of the falling transition of OUTP. In contrast with the duration of the pre-charge phase, the duration of the evaluate phase is variable and depends on the time needed to detect completion of the transition of OUTP or OUTN. As a result, the duty-cycle and/or frequency of the clock signal CLK varies.

A second pre-charge phase begins at time t4 when the clock signal CLK transitions high and OUTP and OUTN are both pre-charged high. The resulting rising transition of OUTP causes COMP_OUT to transition low and NOR_OUT to transition high. The rising transition of NOR_OUT propagates through the feedback circuit 115 to generate a rising edge of the clock signal CLK at time t5, ending the pre-charge phase.

At time t5, the evaluate phase begins and the sampler 105 samples the voltage levels of Vout and Vref. As shown in FIG. 1B, the signal OUTN is driven low at time t6. Note that the delay from t5 to t6 is less than the delay from t1 to t2. Therefore, the second evaluate phase is shorter than the first evaluate phase. The threshold adjusted inverter 103 detects completion of the transition of OUTN from high to low when OUTN falls below the entire transition range of the sampler 105 and reaches the threshold voltage of the NMOS transistor in the threshold adjusted inverter 103. The COMP_OUT signal remains high and the NOR_OUT signal transitions low at time t7. The falling transition of NOR_OUT propagates through the feedback circuit 115 to generate a falling edge of the clock signal CLK at time t8, ending the evaluate phase and beginning a pre-charge phase.

Figure 1C:
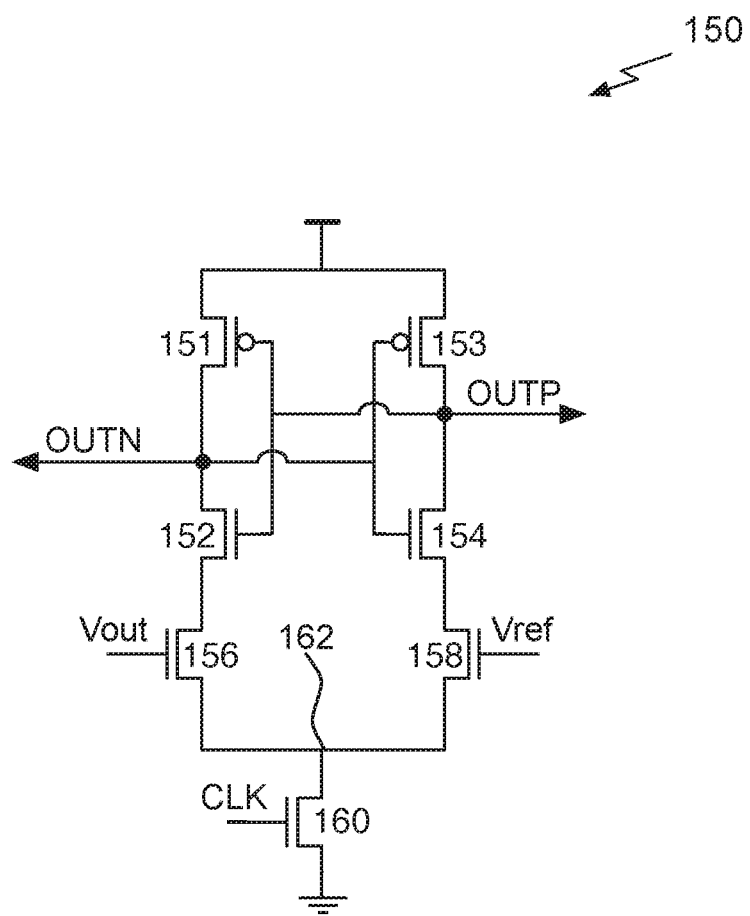
FIG. 1C illustrates a circuit for the sampler shown in FIG. 1A, in accordance with one embodiment.

FIG. 1C illustrates a circuit 150 that implements the sampler 105 shown in FIG. 1A, in accordance with one embodiment. A first inverter including transistors 151 and 152 and a second inverter including transistors 153 and 154 form cross-coupled invertors. A clock-enabled pull-down NMOS transistor 160 coupled between a node 162 and the low power supply (e.g., GND) is enabled when the clock signal CLK is high and is disabled when the clock signal CLK is low. The NMOS transistor 156 is coupled between the first inverter and the node 162 and enabled by the Vout signal. The NMOS transistor 158 is coupled between the second inverter and the node 162 and enabled by the Vref signal.

The Vout and Vref signals are sampled when the clock signal CLK is high to generate OUTP and OUTN. When the clock signal is low, OUTP and OUTN are decoupled from the low supply voltage. If Vout and Vref are equal or nearly equal in value during sampling, neither OUTN nor OUTP transitions low. When Vout is higher than Vref, OUTP remains high and OUTN transitions low. When Vref is higher than Vout, OUTN remains high and OUTP transitions low. In one embodiment a difference of 2-3 mV between the Vref and Vout inputs to a balanced comparator (i.e. offset cancelled) is sufficient to cause a transition at one of the outputs in reasonable amount of time for a high frequency application. A smaller voltage difference can resolve, but more time may be required as the both of the outputs will linger in the metastable region.

Figure 1D:
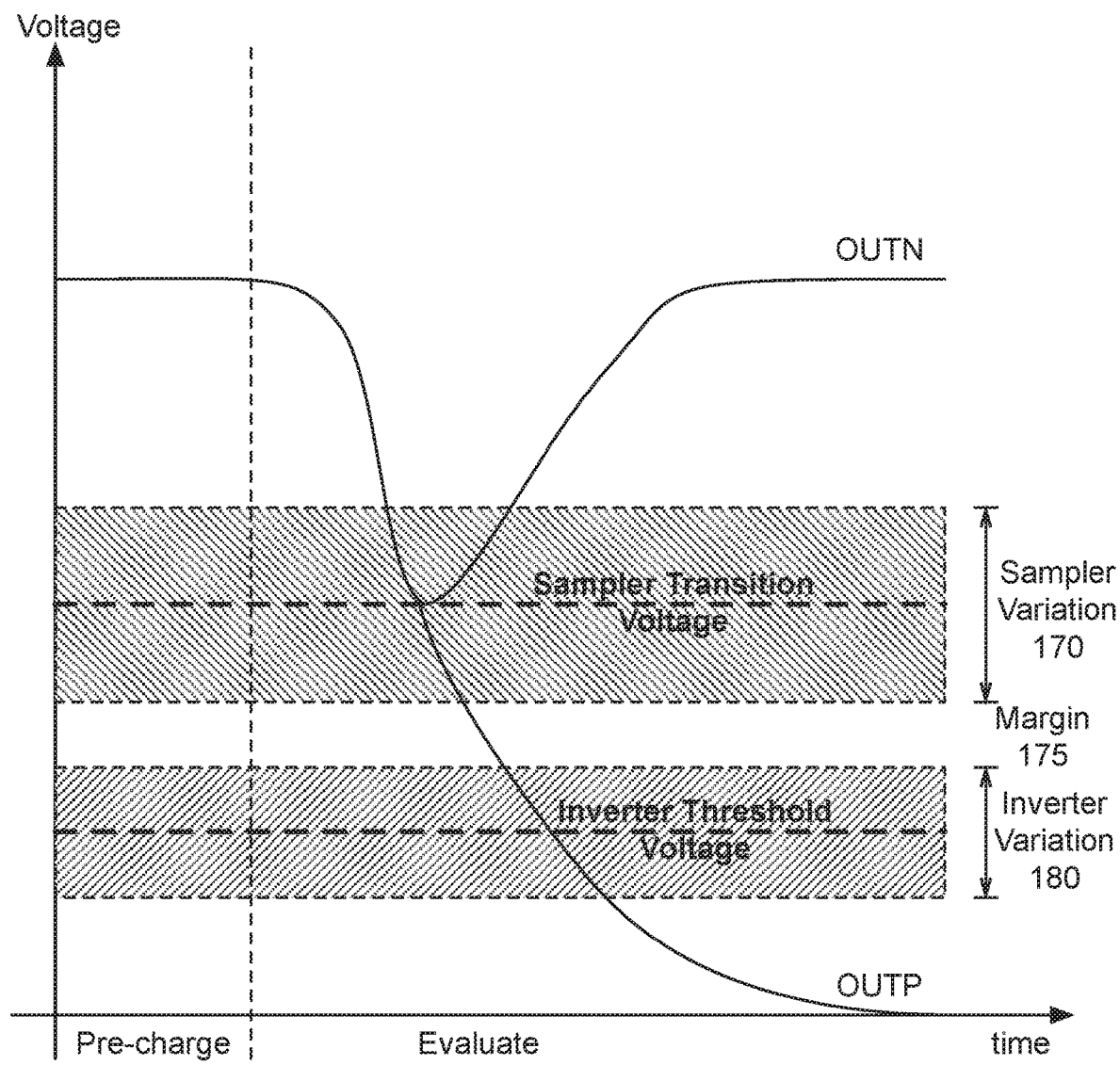
FIG. 1D illustrates a threshold voltage range of a threshold adjusted inverter and a sampler transition voltage range for the self-clocked sampler system shown in FIG. 1A, in accordance with one embodiment.

FIG. 1D illustrates a threshold voltage range of a threshold adjusted inverter 102 or 103 and a sampler transition voltage range for the self-clocked sampler system 100 shown in FIG. 1A, in accordance with one embodiment. The threshold voltage range of the threshold adjusted inverter 102 or 103 is shown as the inverter variation 180. The sampler transition voltage range for the self-clocked sampler system 100 is shown as the sampler variation 170. The sampler variation 170 bounds a metastability state of the sampled signals OUTP and OUTN. A margin 175 separates the inverter variation 180 from the sampler variation 170. The inverter variation 180 and the sampler variation 170 each account for transistor variation due to operating conditions and fabrication process by providing adequate margins. The separation of the inverter variation 180 and the sampler variation 170 by the margin 175 ensures that the voltages at OUTP and OUTN have sufficiently separated and are not in a metastability state during the evaluate phase.

During the pre-charge phase, both the OUTN and OUTP signals are pre-charged high. During the evaluate phase Vout and Vref are sampled by the sampler 105, and, when Vref is greater than Vout, the OUTP signal is driven low by the sampler 105. As shown in FIG. 1D, early in the evaluate phase both the OUTN and OUTP signals fall. When the sampler transition voltage is reached, the OUTN signal rises and the OUTP signal falls. When the OUTN and OUTP signals are both outside of the sampler variation 170, metastability is avoided. When the OUTP signal reaches the inverter threshold voltage that is lower compared with the sampler transition voltage, the threshold adjusted inverter 102 pulls up the COMP_OUT signal. In one embodiment, the threshold adjusted inverters 102 and 103 are constructed using a weak PMOS transistor as a pull-up device and a strong NMOS transistor as a pull-down device. In other words, the NMOS transistor is much wider compared with the PMOS transistor.

As shown in FIG. 1D, the inverter variation 180 is set to be entirely outside of the sampler variation 170 for a 6-sigma variation. The inverter variation 180 can be appropriately adjusted to increase or decrease the margin 175, as need to meet variation limits. Importantly, the inverter variation 180 does not overlap with any portion of the sampler variation 170.

Figure 2A:
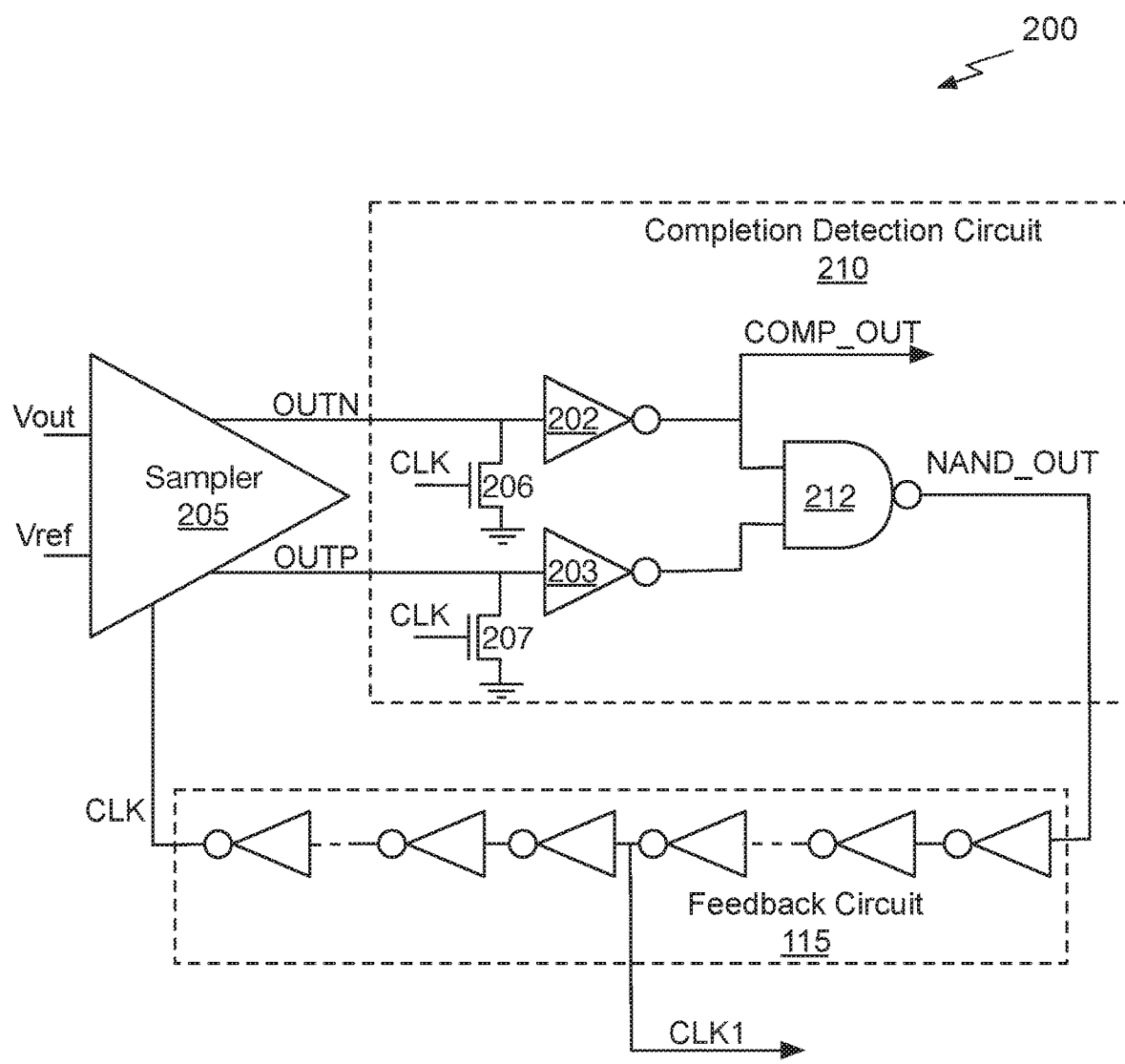
FIG. 2A illustrates another self-clocked sampler system that is the complement of the self-clock sampler system shown in FIG. 1A, in accordance with one embodiment.

FIG. 2A illustrates another self-clocked sampler system 200 that is the complement of the self-clock sampler system 100 shown in FIG. 1A, in accordance with one embodiment. A complement version of the self-clocking sampler system 100 may be implemented be replacing the PMOS pre-charge devices, low-threshold adjusted inverters 102 and 103, and NOR gate 112 with NMOS pre-charge devices, high-threshold adjusted inverters 202 and 203, and a NAND gate 212, respectively.

The self-clocking sampler system 200 includes a sampler circuit 205, a completion detection circuit 210, and the feedback circuit 115 configured in a loop, as shown in FIG. 2A. In one embodiment, the sampler circuit 205 is a standard master stage of cross-coupled sampler circuit. The self-clocking sampler system 200 also operates in the pre-charge and evaluation phases. The sampler 205 samples the voltage levels of Vout and Vref during an evaluate phase and generates output signals OUTP and OUTN. The completion detection circuit 210 includes two pull-down transistors 206 and 207 that are configured to pre-charge the signals OUTP and OUTN to a low supply voltage during the pre-charge phase. The completion detection circuit 210 includes two threshold adjusted inverters 202 and 203 that ensure voltages at OUTP and OUTN have sufficiently separated during the evaluate phase, and are not in a metastability state (i.e., are stable) before the output of one of the threshold adjusted inverters 202 and 203 changes. As shown in FIG. 2A, the two transistors 206 and 207 are NMOS devices and the two threshold adjusted inverters 202 and 203 are high threshold voltage inverters. In one embodiment, the threshold adjusted inverters 202 and 203 are constructed using a strong PMOS transistor as a pull-up device and a weak NMOS transistor as a pull-down device. In other words, the PMOS transistor is much wider compared with the NMOS transistor.

A voltage switching threshold range of the threshold adjusted inverters 202 and 203 is entirely outside of a transition voltage range of the sampler 205. Importantly, there is no overlap between the range of the threshold adjusted inverters and the transition voltage range. The threshold adjusted inverters 202 and 203 sense a change in the state of one of the OUTP and OUTN signals and transition the output of one of the threshold adjusted inverters 202 and 203 low when detection of the state change is complete during the evaluate phase.

The outputs of the two threshold adjusted inverters 202 and 203 are combined using a NAND gate 212 to generate a positive transition (i.e., rising edge) for a NAND OUT signal when either of the OUTP or OUTN signals transitions high during the evaluate phase. The feedback circuit 115 includes an even number of inverters to generate the clock signal CLK. The positive transition of NAND OUT passes through the feedback circuit 115 to generate a positive transition of the clock signal CLK and initiate the pre-charge phase. The positive transition of the NAND OUT signal generates a next edge of the clock signal CLK that is input to the sampler 205 resulting in the self-clocking feature of the self-clocking sampler system 200. The sampler 205 may be implemented using a circuit that is the complement of the circuit 150 shown in FIG. 1C, such as the circuit 250 shown in FIG. 2B.

The output of one of the two threshold adjusted inverters 202 and 203 may be used as a comparator output, COMP_OUT. The comparator output may be provided as an input to additional logic, such as a control loop stage for a voltage regulator implementation. A CLK1 signal may be generated at the output of an inverter in the feedback circuit 115, such that an odd number of inverters are in series between the NAND gate 212 and the inverter that outputs the CLK1 signal. In one embodiment, the CLK1 signal may be buffered and then used to clock subsequent logic stages.

During the pre-charge phase, when CLK is high, both signals OUTP and OUTN are charged to a low supply voltage generating a negative transition of NAND OUT. The negative transition of NAND OUT passes through the feedback circuit 115 to generate a negative transition of the clock signal CLK and initiate the evaluate phase, when CLK is low. One or more of the inverters in the feedback circuit 115 may have a programmable delay so that the frequency of the clock signal CLK can be controlled achieve a desired frequency. For example, the frequency of CLK may be increased, to increase the frequency at which Vout and Vref are sampled, by reducing the delay through the feedback circuit 115.

The self-clocking sampler system 200 avoids the need for series coupled metastability hardened flops and reduces the feedback loop delay, thereby improving response time. Quick response time is needed to regulate a supply voltage level, such as Vout to be close to Vref while also limiting voltage ripple. The self-clocking sampler system 200 may be integrated into a die including a processor to regulate a voltage level and the higher switching frequencies at which the sampler 205 is operated limits the voltage ripple of Vout. In a conventional integrated circuit, the higher frequency would increase the probability of metastability. However, the self-clocking feature of the self-clocking sampler system 200 prevents the likelihood of metastability.

Figure 2B:
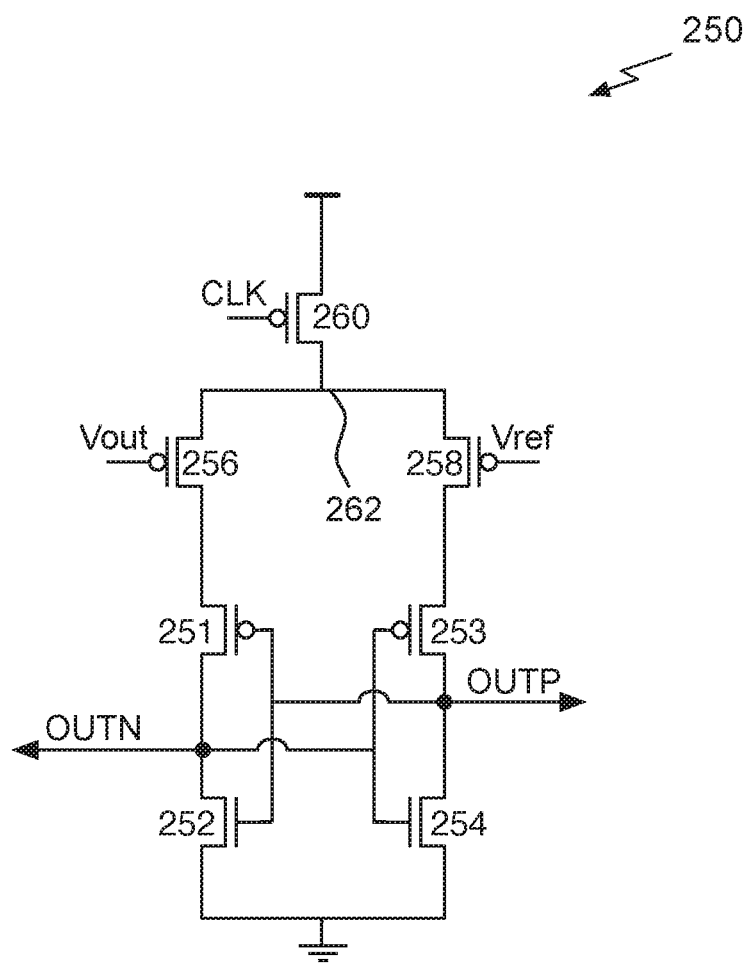
FIG. 2B illustrates a circuit for the sampler shown in FIG. 2A, in accordance with one embodiment.

FIG. 2B illustrates a circuit 250 that implements the sampler 205 shown in FIG. 2A, in accordance with one embodiment. A first inverter including transistors 251 and 252 and a second inverter including transistors 253 and 254 form cross-coupled invertors. A clock-enabled pull-up PMOS transistor 260 coupled between a node 262 and the high power supply (e.g., VDD) is enabled when the clock signal CLK is low and is disabled when the clock signal CLK is high. The PMOS transistor 256 is coupled between the first inverter and the node 262 and enabled by the Vout signal. The PMOS transistor 258 is coupled between the second inverter and the node 262 and enabled by the Vref signal.

The Vout and Vref signals are sampled when the clock signal CLK is low to generate OUTP and OUTN. When the clock signal is high, OUTP and OUTN are decoupled from the high supply voltage. If Vout and Vref are equal or nearly equal in value during sampling, neither OUTN nor OUTP transitions high. When Vout is higher than Vref, OUTN remains low and OUTP transitions high. When Vref is higher than Vout, OUTP remains low and OUTN transitions high. In one embodiment a difference of 2-3 mV between the Vref and Vout inputs to a balanced comparator (i.e. offset cancelled) is sufficient to cause a transition at one of the outputs in reasonable amount of time for a high frequency application. A smaller voltage difference can resolve, but more time may be required, as the both of the outputs will linger in the metastable region.

Figure 2C:
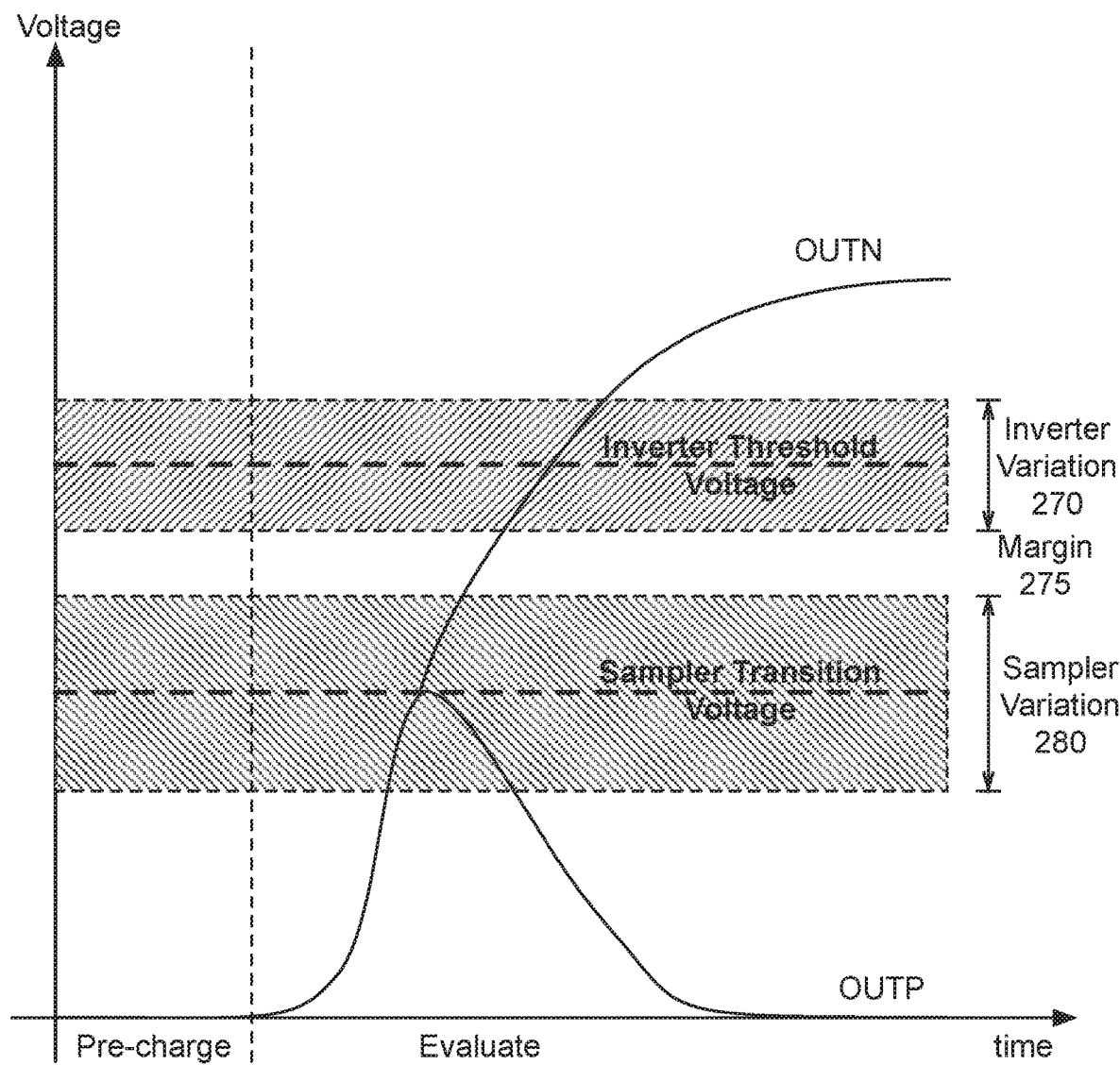
FIG. 2C illustrates an inverter threshold voltage range and a sampler transition range for the self-clocked sampler system shown in FIG. 2A, in accordance with one embodiment.

FIG. 2C illustrates a threshold voltage range of a threshold adjusted inverter 202 or 203 and a sampler transition voltage range for the self-clocked sampler system 200 shown in FIG. 2A, in accordance with one embodiment. The threshold voltage range of the threshold adjusted inverter 202 or 203 is shown as the inverter variation 270. The sampler transition voltage range for the self-clocked sampler system 200 is shown as the sampler variation 280. A margin 275 separates the inverter variation 270 from the sampler variation 280. The inverter variation 270 and the sampler variation 280 each account for transistor variation due to operating conditions and fabrication process by providing adequate margins. The separation of the inverter variation 270 and the sampler variation 280 by the margin 275 ensures that the voltages at OUTP and OUTN have sufficiently separated and are not in a metastability state during the evaluate phase.

During the pre-charge phase, both the OUTN and OUTP signals are pre-charged low. During the evaluate phase Vout and Vref are sampled by the sampler 205, and, when Vref is greater than Vout, the OUTP signal is driven low by the sampler 205. As shown in FIG. 2C, early in the evaluate phase both the OUTN and OUTP signals rise. When the sampler transition voltage is reached, the OUTN signal rises and the OUTP signal falls. When the OUTN and OUTP signals are both outside of the sampler variation 280, metastability is avoided. When the OUTN signal reaches the inverter threshold voltage that is higher compared with the sampler transition voltage, the threshold adjusted inverter 202 pulls down the COMP_OUT signal.

As shown in FIG. 2C, the inverter variation 270 is set to be entirely outside of the sampler variation 280 for a 6-sigma variation. The inverter variation 270 can be appropriately adjusted to increase or decrease the margin 275, as need to meet variation limits. Importantly, the inverter variation 270 does not overlap with any portion of the sampler variation 280.

Figure 3:
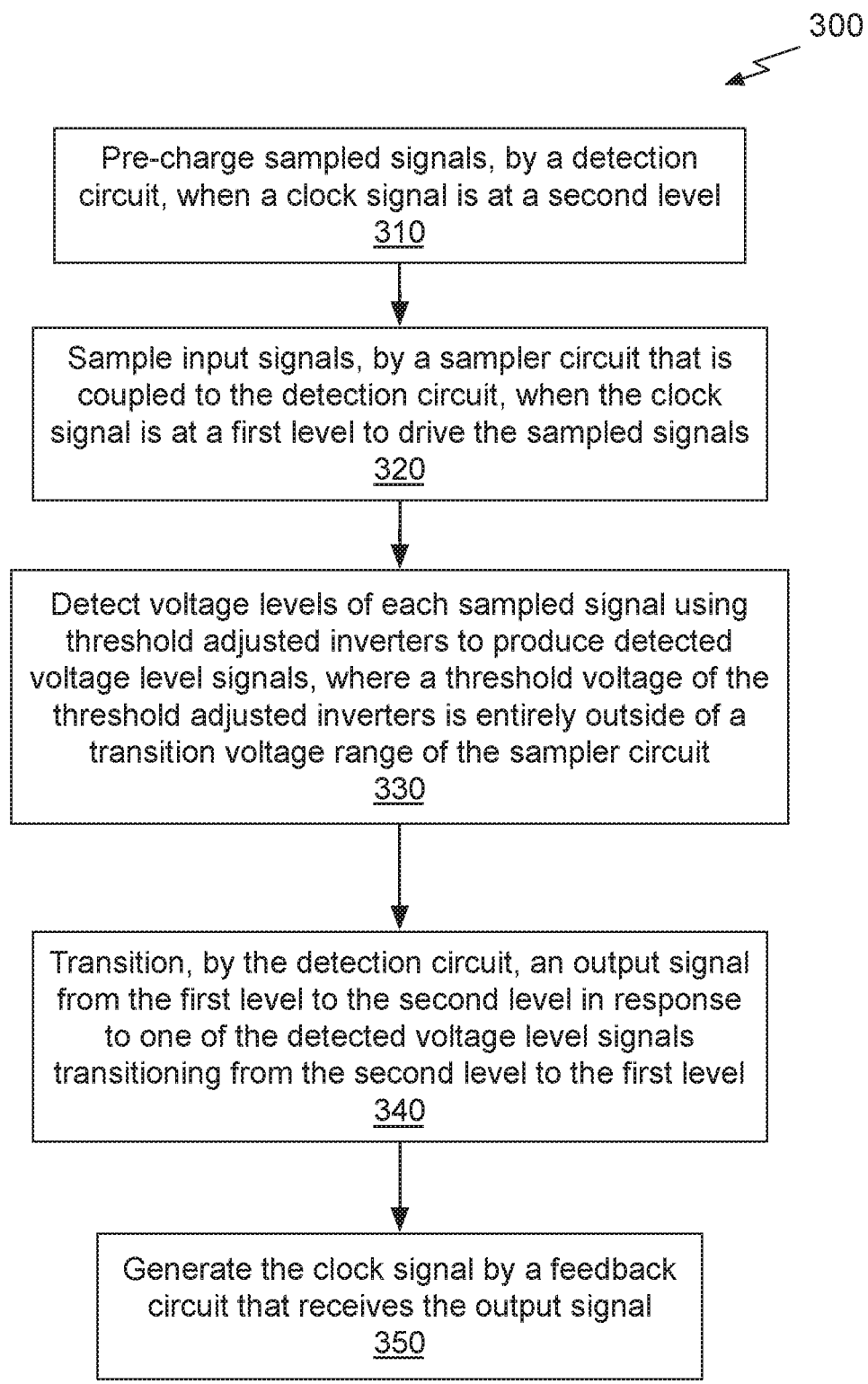
FIG. 3 illustrates a flowchart of a method for a self-clocked sampler system, in accordance with one embodiment.

FIG. 3 illustrates a flowchart of a method 300 for the self-clocked sampler system 100 or 200, in accordance with one embodiment. Although method 300 is described in the context of the self-clocked sampler system 100 or 200, the method 300 may also be performed by a program, custom circuitry, or by a combination of custom circuitry and a program. The method 300 may be performed within a GPU (graphics processing unit), CPU (central processing unit), deep learning accelerator (DLA), or any processor including the self-clocked sampler system 100 or 200. Furthermore, persons of ordinary skill in the art will understand that any system that performs method 300 is within the scope and spirit of embodiments of the present invention.

At step 310, a detection circuit pre-charges sampled signals output by a sampler circuit when a clock signal is at a second level. In one embodiment, the detection circuit is the completion detection circuit 110, the first level is a high voltage level, the second voltage level is a low voltage level and the sampled signals are OUTP and OUTN that are pre-charged to the high voltage level. In one embodiment, the detection circuit is the completion detection circuit 210, the first level is a low voltage level, the second voltage level is a high voltage level, and the sampled signals are pre-charged to the low voltage level.

At step 320, a sampler circuit, such as the sampler 105 or 205 that is coupled to the completion detection circuit 110, samples input signals (e.g., Vref and Vout) when the clock signal (e.g., CLK) is at a first level to drive the sampled signals (e.g., OUTP and OUTN). At step 330, using threshold adjusted inverters, the detection circuit detects voltage levels of each sampled signal to produce detected voltage level signals (e.g., the outputs of threshold adjusted inverters 102 and 103 or 202 and 203). A threshold voltage of the threshold adjusted inverters is entirely outside of a transition voltage range of the sampler circuit. In one embodiment, the threshold voltage is higher than the transition voltage range of the sampler circuit. In another embodiment, the threshold voltage is lower than the transition voltage range of the sampler circuit.

At step 340, in response to one of the detected voltage level signals transitioning from the second level to the first level, the detection circuit transitions an output signal (e.g., NOR_OUT or NAND OUT) from the first level to the second level. At step 350, a feedback circuit, such as the feedback circuit 115, receives the output signal and generates the clock signal.

Figure 4A:
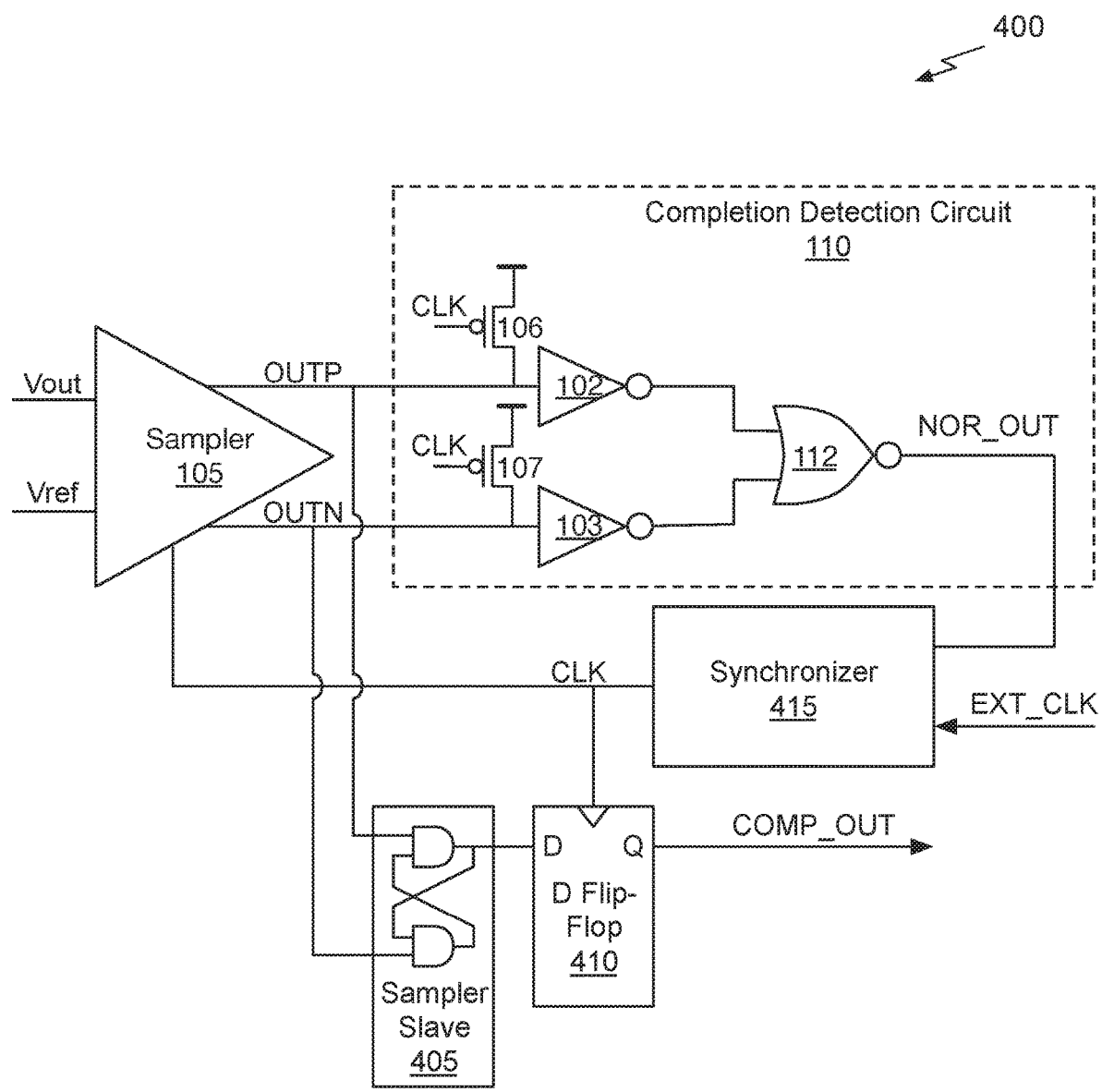
FIG. 4A illustrates a sampler system that is synchronized with an external clock, in accordance with one embodiment.

FIG. 4A illustrates a sampler system 400 that is synchronized with an external clock, in accordance with one embodiment. The self-clocked sampler system 400 can be synchronized with an external clock signal, EXT_CLK, and the external clock may be gated to provide additional time to resolve metastability.

The sampler system 400 includes the sampler circuit 105, the completion detection circuit 110, and a synchronizer 415 configured in a loop. The synchronizer 415 is a feedback circuit that includes one or more flip-flops configured in series to generate the clock signal CLK using the NOR_OUT as an input and the EXT_CLK signal as the clock. The negative transition of NOR_OUT passes through the synchronizer 415 to generate a negative transition of the clock signal CLK and initiate the pre-charge phase. The negative transition of the NOR_OUT signal generates a next edge of the clock signal CLK that is input to the sampler 105 resulting in the self-clocking feature of the sampler system 400.

Figure 4B:
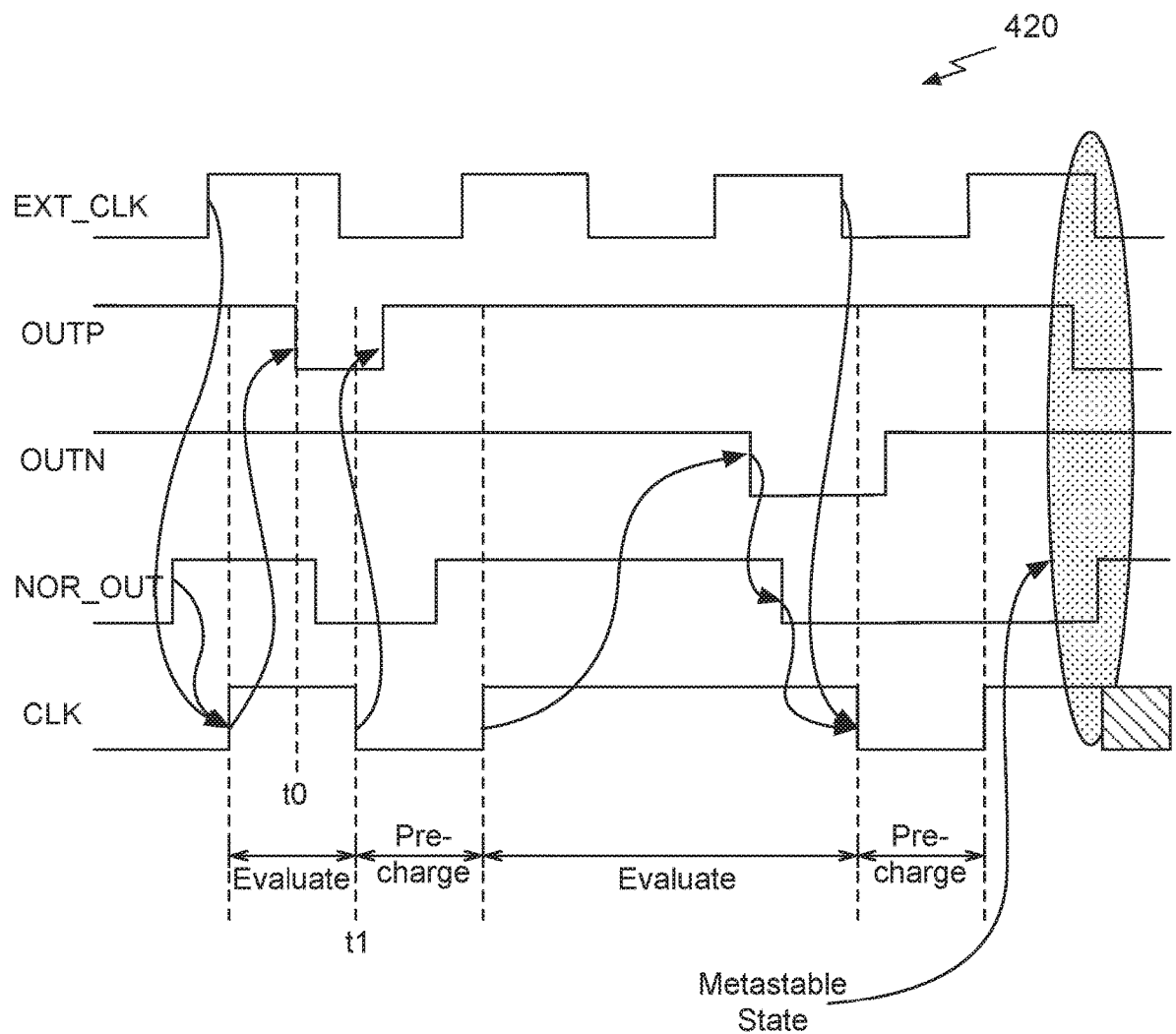
FIG. 4B illustrates a timing diagram of signals generated within the sampler system shown in FIG. 4A, in accordance with one embodiment.

The sampler 105 functions as a sampler master and is followed with a sampler slave 405 that holds the values of the OUTP and OUTN signals at the end of an evaluation phase through a subsequent pre-charge phase. The output of the sampler slave 405 is stored a D-Flip-flop 410 to generate COMP_OUT. However, the presence of the external clock results in metastability, as shown in FIG. 4B, or introduces delays in the feedback loop from the completion detection circuit 110 to the sampler 105. In contrast, the self-clocked sampler systems 100 and 200 eliminate the external clock and reduce the probability of metastability.

FIG. 4B illustrates a timing diagram 420 of signals generated within the sampler system 400 shown in FIG. 4A, in accordance with one embodiment. During the first clock cycle the sampler 105 resolves the signals OUTP and OUTN within half a cycle of the external clock EXT_CLK at time t0 and the signals OUTP and OUTN are pre-charged when the CLK signal transitions low at time t1. However, during the second cycle of the external clock EXT_CLK, the sampler 105 is unable to resolve the signals OUTP and OUTN within one clock cycle of EXT_CLK. So the clock signal generated by the synchronizer 415, CLK, is stretched to wait till the next cycle of the EXT_CLK and then pre-charge begins in the negative half of the next cycle of CLK. However, the problem of metastability still exists, but is pushed to the synchronizer 415. When the NOR_OUT and the EXT_CLK edges are close to one another, as shown in the shaded region, more time is needed to resolve the metastable state. Therefore, the sampling frequency is reduced and the response time of the sampler system 400 is reduced.

Figure 5A:
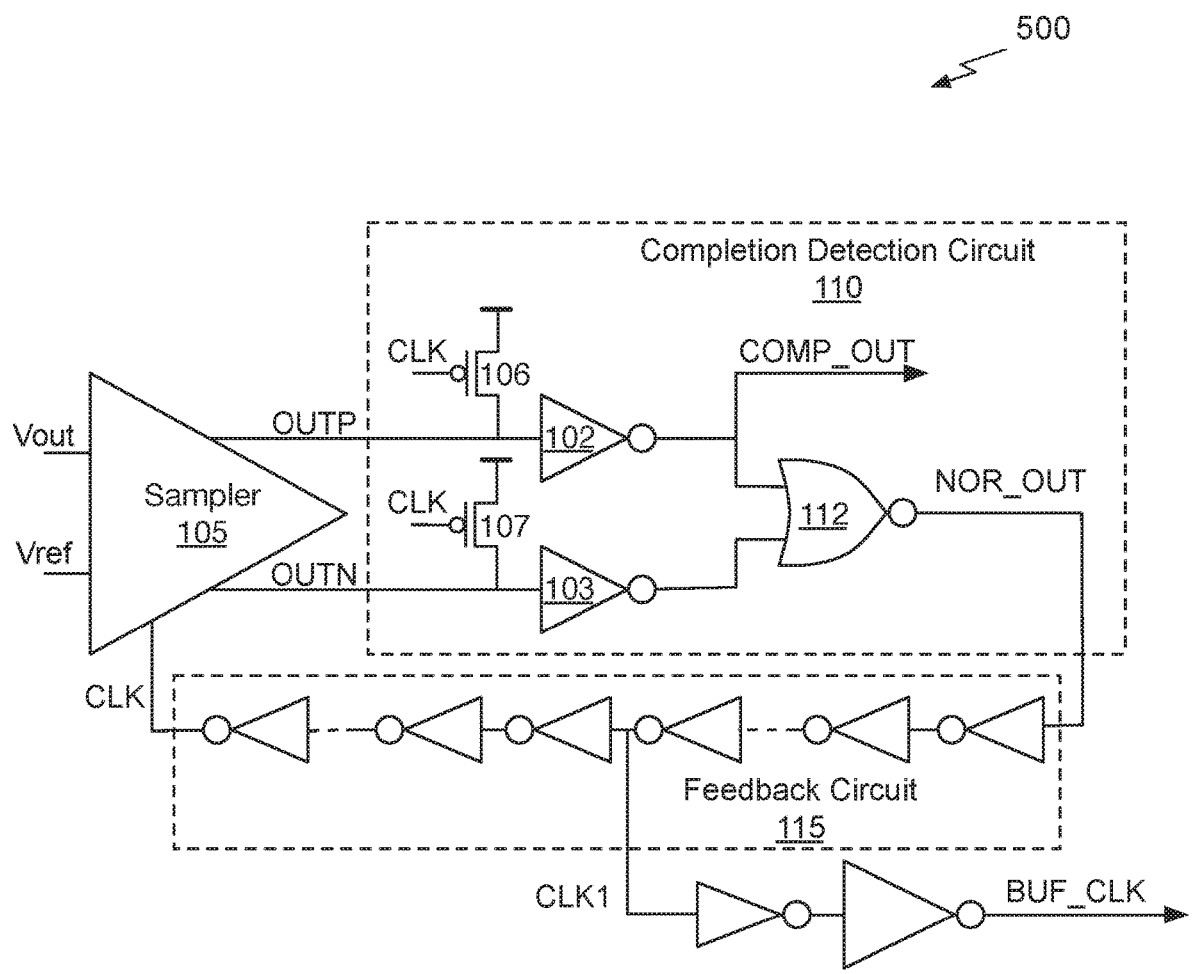
FIG. 5A illustrates the self-clocked sampler system of FIG. 1A with a buffered clock output, in accordance with one embodiment.

FIG. 5A illustrates the self-clocked sampler system of FIG. 1A with a buffered clock output BUF_CLK, in accordance with one embodiment. The self-clocking sampler system 500 includes the sampler circuit 105, the completion detection circuit 110, and the feedback circuit 115 configured in a loop. The feedback circuit 115 includes an even number of inverters to generate the clock signal CLK. The negative transition of NOR_OUT passes through the feedback circuit 115 to generate a negative transition of the clock signal CLK and initiate the pre-charge phase. The negative transition of the NOR_OUT signal generates a next edge of the clock signal CLK that is input to the sampler 105 resulting in the self-clocking feature of the self-clocking sampler system 100. The CLK1 signal may be generated at the output of an inverter in the feedback circuit 115, such that an odd number of inverters are in series between the NOR gate 112 and the inverter that outputs the CLK1 signal. The CLK1 signal is buffered to generate the buffered clock signal BUF_CLK that may be used to clock subsequent logic stages.

Figure 5B:
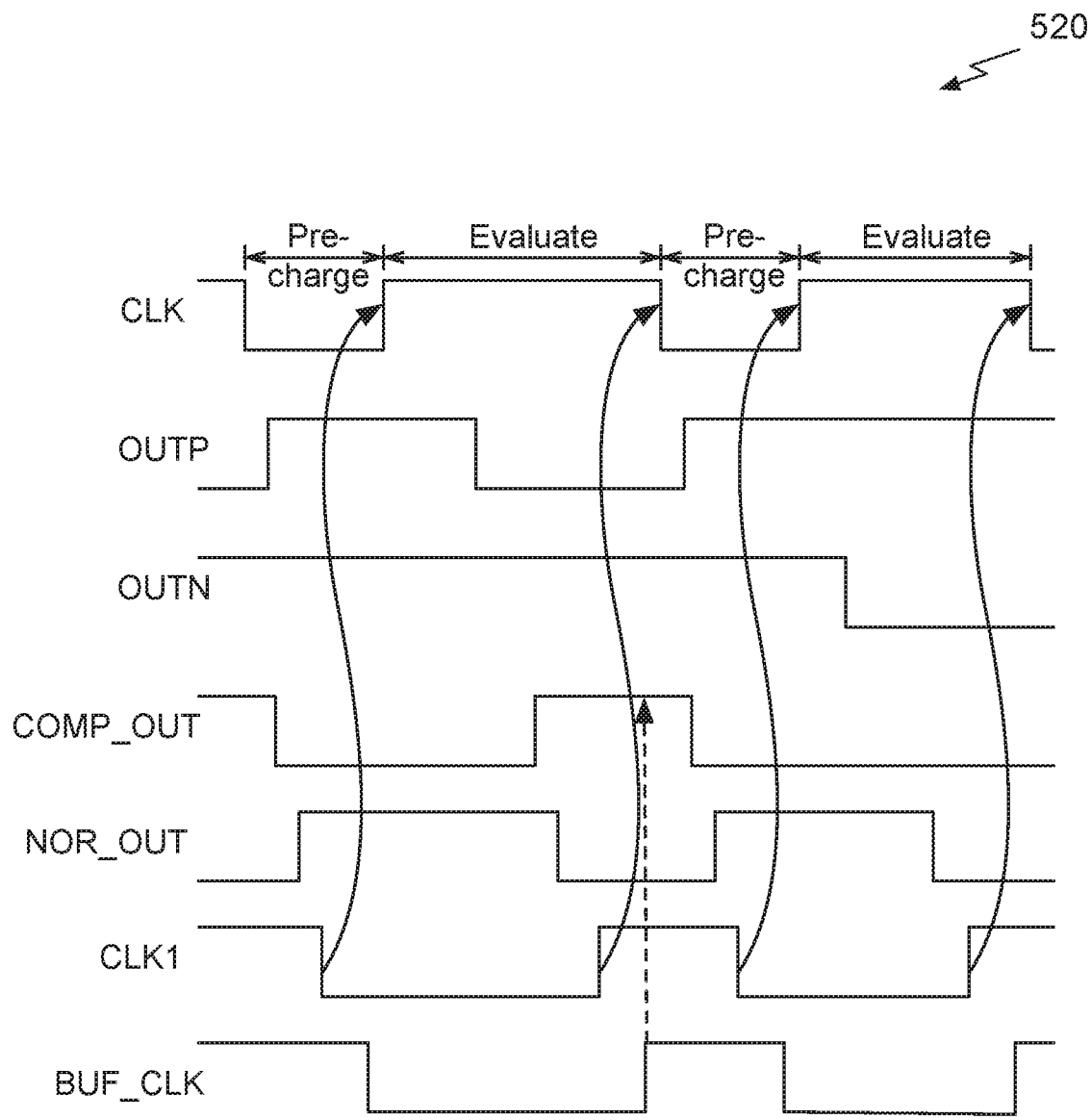
FIG. 5B illustrates a timing diagram of signals generated within the self-clocked sampler system shown in FIG. 5A, in accordance with one embodiment.

FIG. 5B illustrates a timing diagram 520 of signals generated within the self-clocked sampler system 500 shown in FIG. 5A, in accordance with one embodiment. The timing diagram 520 includes the BUF_CLK signal and the signals shown in the timing diagram 120 of FIG. 1B. The BUF_CLK signal may be used as a clock signal input to a positive edge triggered flip-flop to capture the COMP_OUT signal. In one embodiment, the CLK1 signal may be buffered and then used to clock subsequent logic stages.

Exemplary System

Figure 5C:
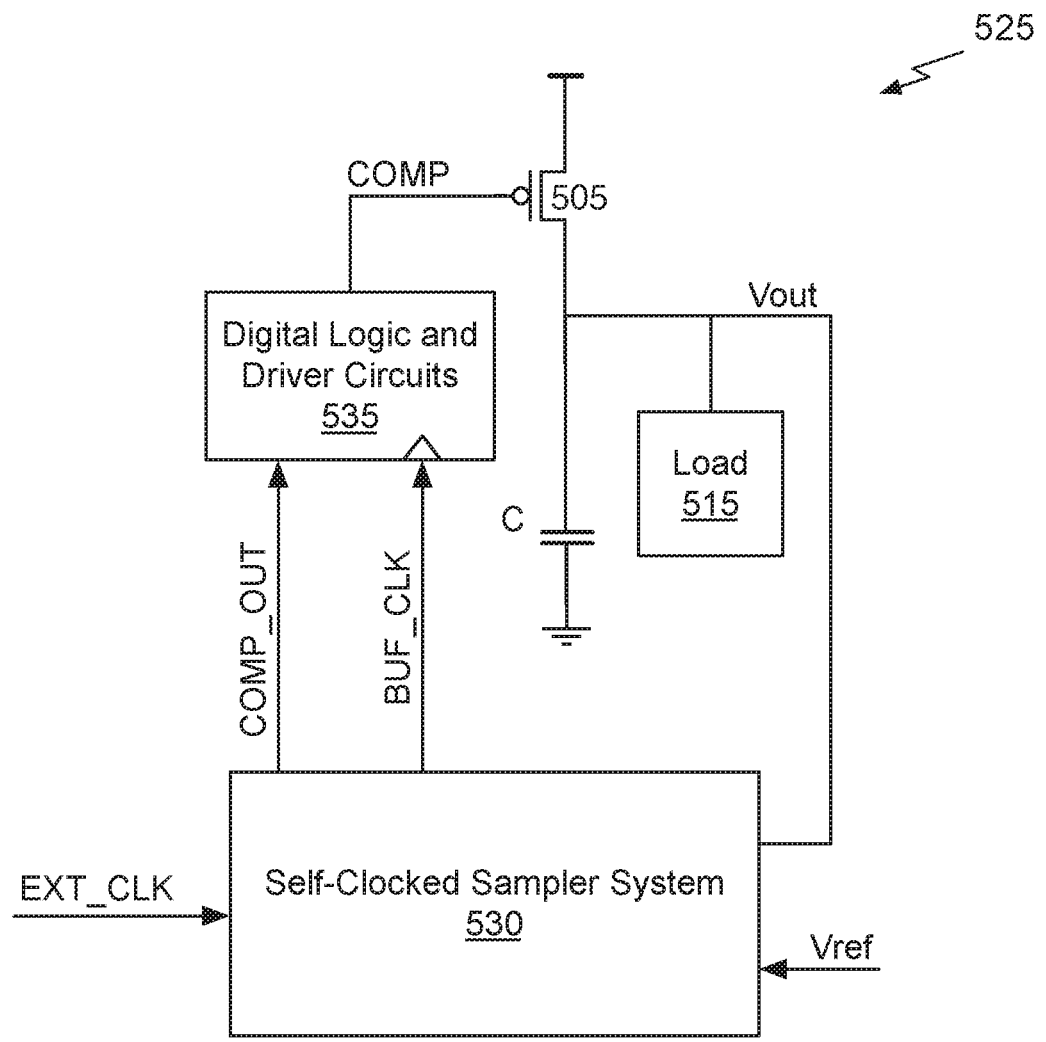
FIG. 5C illustrates a block diagram of a voltage regulator that includes a self-clocked sampler system, in accordance with one embodiment.

FIG. 5C illustrates a self-clocked voltage regulation system 525 including a self-clocked sampler system 530, according to one embodiment. The self-clocked sampler system 530 may be one of the self-clocked sampler system 100, 200, 400, or 500. A power supply voltage is coupled to a PMOS transistor 505 that is enabled by a COMP signal generated by a digital logic and driver circuits 535 based on the COMP_OUT and BUF_CLK signals from the self-clocked sampler system 530. In general, the COMP signal pulses low to enable the PMOS transistor 505 when Vout is less than VRef. The PMOS transistor 505 is configured to regulate the voltage level, Vout, at the load 515. In one embodiment, the self-clocked sampler system 530 is configured to maintain the voltage level at Vout within a predetermined range of Vref. When the self-clocked voltage regulation system 525 is integrated onto a die with other circuitry the passive components are smaller, so that higher sampling frequencies are needed to limit the ripple voltage of Vout. The higher sampling frequencies typically increase the probability of metastability. However, the self-clocked sampler system 530 may operate at the highest possible frequency while ensuring that OUTP and OUTN are stable.

Figure 5D:
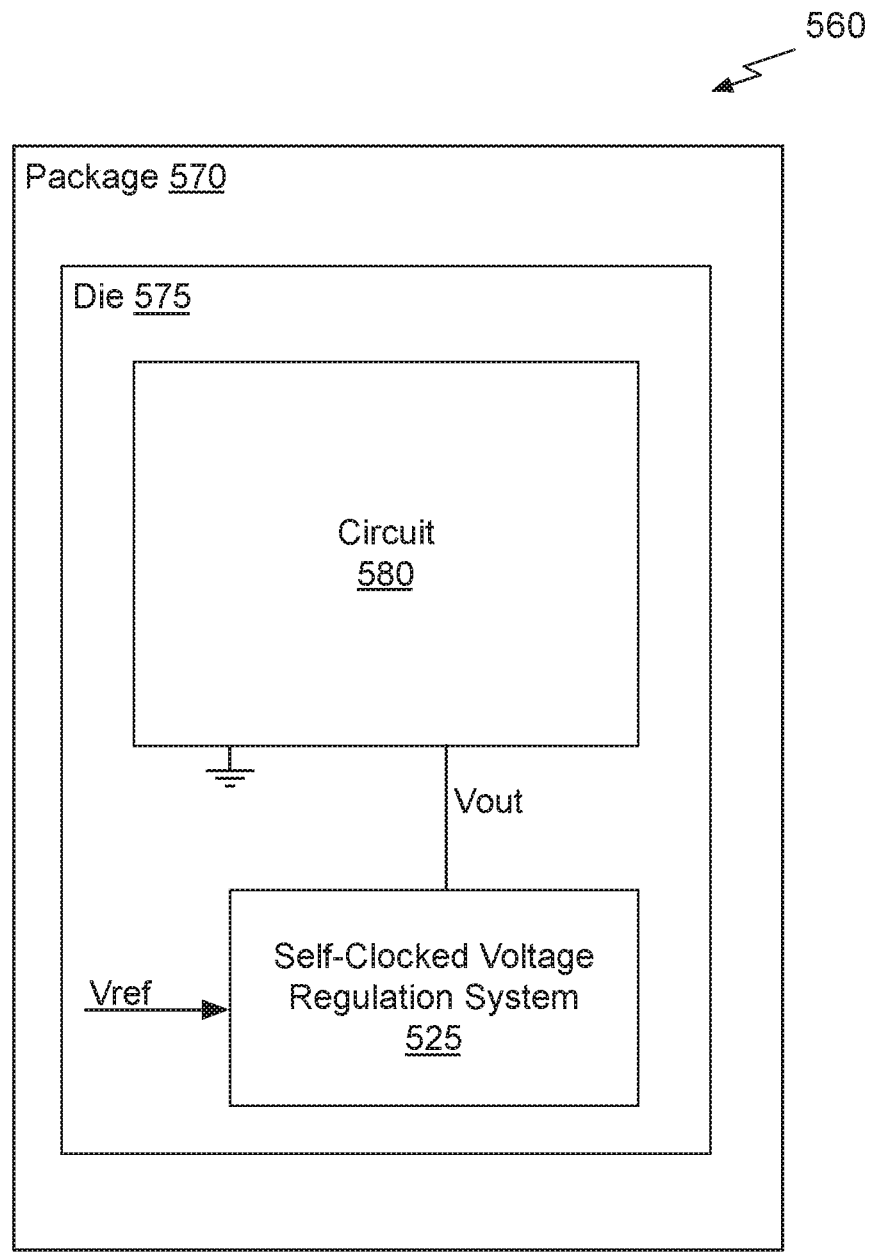
FIG. 5D illustrates the self-clocked sampler system of FIG. 5C within an integrated circuit, in accordance with one embodiment.

FIG. 5D illustrates the self-clocked voltage regulation system 525 of FIG. 5C within an integrated circuit 560, in accordance with one embodiment. A package 570 encloses a circuit 580 and the self-clocked voltage regulation system 525. The circuit 580 replaces the load 515 within the self-clocked voltage regulation system 525. The circuitry within the self-clocked voltage regulation system 525 may be fabricated as part of the die 575 that includes the circuit 580.

Figure 6:
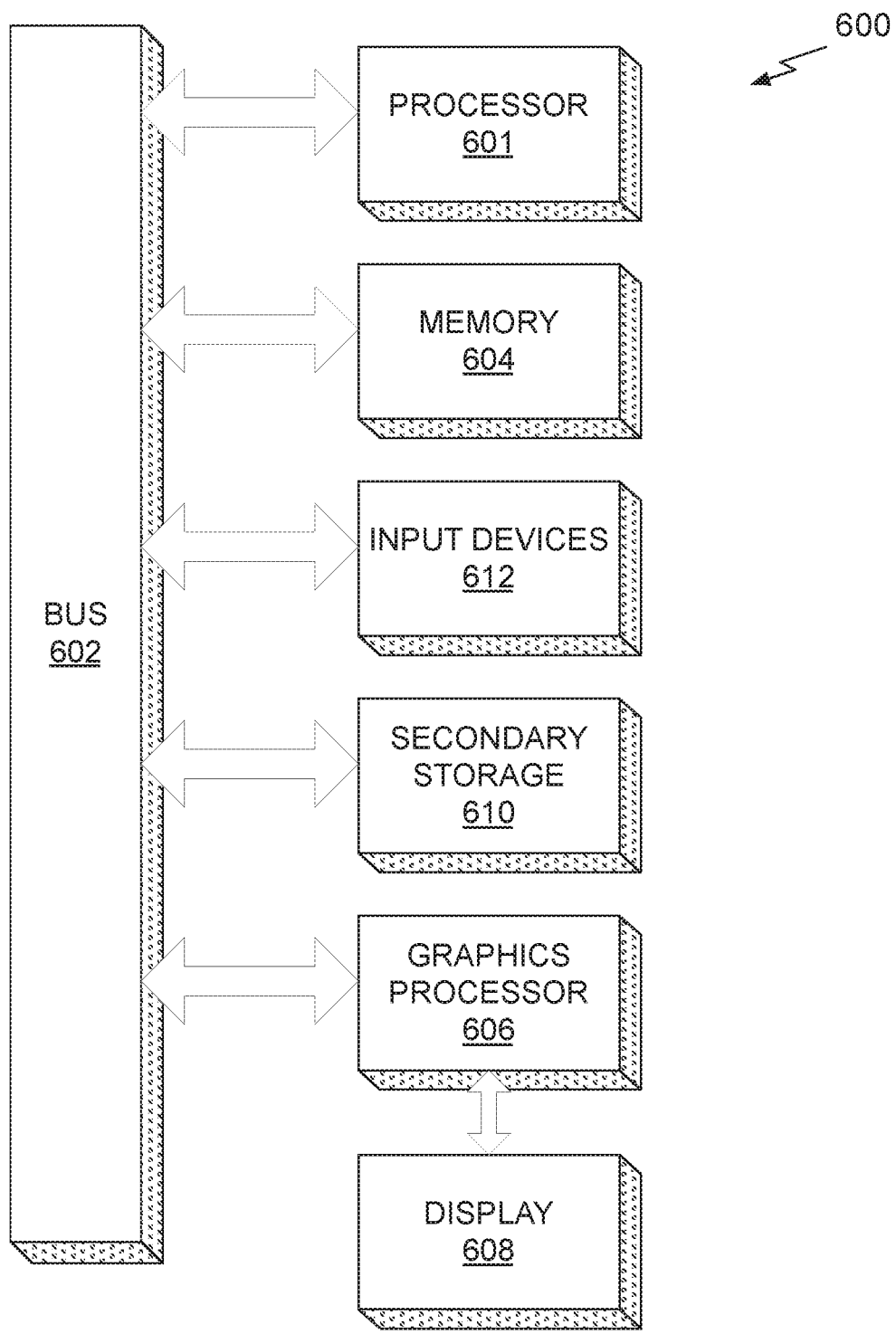
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. The exemplary system 600 may be configured to include the self-clocked voltage regulation system 525 and/or the self-clocked sampler system 100, 200, and/or 400.

As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). In one embodiment, the communication bus 602 is the system bus 302 shown in FIG. 3. The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A self-clocked sampler system, comprising:
a sampler circuit configured to sample input signals when a clock signal is at a first level to produce sampled signals;
a detection circuit that is coupled to the sampler circuit and configured to:
pre-charge the sampled signals when the clock signal is at a second voltage level;
detect a voltage level of a first one of the sampled signals by a first threshold adjusted inverter, wherein a threshold voltage of the first threshold adjusted inverter is entirely outside of a transition voltage range of the sampler circuit;
detect a voltage level of a second one of the sampled signals by a second threshold adjusted inverter, wherein a threshold voltage of the second threshold adjusted inverter is entirely outside of the transition voltage range of the sampler circuit; and
combine the detected voltage levels of the first and second sampled signals to transition an output signal from the first level to the second level in response to one of the detected voltage levels of the first and second sampled signals transitioning from the second voltage level to the first voltage level; and
a feedback circuit configured to receive the output signal and generate the clock signal.

2. The system of claim 1, wherein the feedback circuit comprises an even number of inverters coupled in series.

3. The system of claim 2, wherein a delay of at least one inverter in the even number of inverters is programmable.

4. The system of claim 2, wherein an output of a first inverter in the even number of inverters is a clock output signal.

5. The system of claim 1, wherein the threshold voltage is lower than the transition voltage range.

6. The system of claim 5, wherein the first threshold adjusted inverter is coupled to a first one of the sampled signals and the second threshold adjusted inverter is coupled to a second one of the sampled signals and outputs of the first and second threshold adjusted inverters are coupled to inputs of a NOR gate to produce the output signal.

7. The system of claim 1, wherein the threshold voltage is higher than the transition voltage range.

8. The system of claim 7, wherein the first threshold adjusted inverter is coupled to a first one of the sampled signals and the second threshold adjusted inverter is coupled to a second one of the sampled signals and outputs of the first and second threshold adjusted inverters are coupled to inputs of a NAND gate to produce the output signal.

9. The system of claim 1, wherein the feedback circuit comprises one or more flip-flops coupled in series.

10. The system of claim 1, wherein a frequency of the clock signal varies.

11. The system of claim 1, wherein the transition voltage range bounds a metastability state of the sampled signals.

12. The system of claim 1, wherein one of the detected voltage levels of the first and second sampled signals is a voltage comparison output signal.

13. A computer-implemented method, comprising:
pre-charging sampled signals, by a detection circuit, when a clock signal is at a second voltage level;
sampling input signals, by a sampler circuit, when the clock signal is at a first voltage level to drive the sampled signals;
detecting a voltage level of a first one of the sampled signals by a first threshold adjusted inverter, wherein a threshold voltage of the first threshold adjusted inverter is entirely outside of a transition voltage range of the sampler circuit;
detecting a voltage level of a second one of the sampled signals by a second threshold adjusted inverter, wherein a threshold voltage of the second threshold adjusted inverters is entirely outside of the transition voltage range of the sampler circuit;
combining, by the detection circuit, the detected voltage levels of the first and second sampled signals to transition an output signal from the first voltage level to the second voltage level in response to one of the detected voltage levels of the first and second sampled signals transitioning from the second voltage level to the first voltage level; and
generating the clock signal by a feedback circuit that receives the output signal.

14. The computer-implemented method of claim 13, wherein the feedback circuit comprises an even number of inverters coupled in series.

15. The computer-implemented method of claim 14, wherein a delay of at least one inverter in the even number of inverters is programmable.

16. The computer-implemented method of claim 14, wherein an output of a first inverter in the even number of inverters is a clock output signal.

17. The computer-implemented method of claim 13, wherein the threshold voltage is lower than the transition voltage range.

18. The computer-implemented method of claim 13, wherein the threshold voltage is higher than the transition voltage range.

19. The computer-implemented method of claim 13, wherein the transition voltage range bounds a metastability state of the sampled signals.

20. The computer-implemented method of claim 13, wherein one of the detected voltage levels of the first and second sampled signals is a voltage comparison output signal.

* * * * *

UNITED STATES PATENT AND TRADEMARK OFFICE
CERTIFICATE OF CORRECTION

PATENT NO. : 10,644,686 B2
APPLICATION NO. : 16/700839
DATED : May 5, 2020
INVENTOR(S) : Poulton et al.

Page 1 of 1

It is certified that error appears in the above-identified patent and that said Letters Patent is hereby corrected as shown below:

In the Specification

Column 1, Line 10, please add the following after the Claim of Priority paragraph:
-- STATEMENT REGARDING FEDERALLY SPONSORED RESEARCH AND DEVELOPMENT
This invention was made with US Government support under LLNS subcontract B609911 awarded by DOE. The US Government has certain rights in this invention. --

Signed and Sealed this
Twenty-eighth Day of July, 2020

Andrei Iancu
*Director of the United States Patent and Trademark Office*